(12) United States Patent
Bao et al.

(10) Patent No.: US 11,977,111 B2
(45) Date of Patent: May 7, 2024

(54) PULL OUT-ASSISTING LINKAGE DEVICE FOR TEST LOAD BOARD OF AUTOMATIC SEMICONDUCTOR TEST EQUIPMENT

(71) Applicant: NAN JING MACROTEST SEMICONDUCTOR TECHNOLOGY CO., LTD, Nanjing (CN)

(72) Inventors: Zhijie Bao, Nanjing (CN); Kunling Zhao, Nanjing (CN)

( * ) Notice: Subject to any disclaimer, the term of this patent is extended or adjusted under 35 U.S.C. 154(b) by 126 days.

(21) Appl. No.: 17/638,193

(22) PCT Filed: Oct. 27, 2020

(86) PCT No.: PCT/CN2020/124071
§ 371 (c)(1),
(2) Date: Feb. 25, 2022

(87) PCT Pub. No.: WO2021/093580
PCT Pub. Date: May 20, 2021

(65) Prior Publication Data
US 2022/0326295 A1    Oct. 13, 2022

(30) Foreign Application Priority Data
Nov. 12, 2019  (CN) .......................... 201911098096.9

(51) Int. Cl.
*G01R 31/26*     (2020.01)
*G01R 1/02*      (2006.01)
*G01R 31/28*     (2006.01)

(52) U.S. Cl.
CPC ............ *G01R 31/2601* (2013.01); *G01R 1/02* (2013.01); *G01R 31/2834* (2013.01)

(58) Field of Classification Search
CPC .... G01R 31/00; G01R 31/26; G01R 31/2601; G01R 31/28; G01R 31/2832; G01R 31/2834; G01R 1/00; G01R 1/02
(Continued)

(56) References Cited

U.S. PATENT DOCUMENTS 4,782,291 A * 11/1988 Blandin ............. G01R 31/2868
324/750.08
6,614,222 B1 * 9/2003 Yu ...................... G01R 31/2887
324/757.01
(Continued)

FOREIGN PATENT DOCUMENTS

CN      201975630 U     9/2011
CN      102761022 A    10/2012
(Continued)

OTHER PUBLICATIONS

ISR of PCT/CN2020/124071.

*Primary Examiner* — Hoai-An D. Nguyen
(74) *Attorney, Agent, or Firm* — Zhigang Ma (57) ABSTRACT

A pull out-assisting linkage device for load board of semiconductor automatic test equipment. One end of the handle is rotatably connected to the test equipment by a rotating member. The middle of the handle is bolted to the linkage. The two rotating plates are fixedly connected to the linkage and are located at the two ends of the linkage. Each rotating plate is rotatably connected to the test equipment. Both the first pull out-assisting rod and the second pull out-assisting rod are fixedly connected to each rotating plate by a universal connecting rod. The first pull out-assisting rod and the second pull out-assisting rod are slidingly connected to the test equipment. The first pull out-assisting rod has a first pull out-assisting slot in the side wall, and the second pull out-assisting rod has a second pull out-assisting slot in the side wall, with the first pull out-assisting slot and the second (Continued)

pull out-assisting slot set in reverse. The present invention makes the pull out-assisting device more accurate in propulsion distance, simple in structure, and low in investment cost.

10 Claims, 5 Drawing Sheets (58) Field of Classification Search
USPC .................................. 324/500, 537, 762.01
See application file for complete search history.

(56) References Cited

U.S. PATENT DOCUMENTS

| 2002/0187678 | A1  | 12/2002 | Takahashi |           |
|--------------|-----|---------|-----------|-----------|
| 2007/0205753 | A1* | 9/2007  | Hau ........................ | G01R 3/00 |
|              |     |         |           | 324/758.01 |

FOREIGN PATENT DOCUMENTS

| CN | 203423894 U | 2/2014  |
|----|-------------|---------|
| CN | 203827661 U | 9/2014  |
| CN | 108063347 A | 5/2018  |
| CN | 108767525 A | 11/2018 |
| CN | 208570990 U | 3/2019  |
| CN | 208589566 U | 3/2019  |
| CN | 110824324 A | 2/2020  |

* cited by examiner

PULL OUT-ASSISTING LINKAGE DEVICE FOR TEST LOAD BOARD OF AUTOMATIC SEMICONDUCTOR TEST EQUIPMENT

FIELD OF THE INVENTION

The present invention relates to the field of automatic semiconductor test equipment, and more particularly to a load board pull out-assisting linkage device for semiconductor automatic test equipment.

BACKGROUND OF THE RELATED ART

Semiconductor automatic test equipment testing is the testing of IC or chips to determine whether the IC or chip function meets customer requirements by comparing the output and theoretical values of the measured circuit or chip. The load board is interfaced with a probe station or a packaging testing machine to realize the testing of IC or chips. Since the load board is connected to the semiconductor automatic test equipment through a European-style socket, the load board must be replaced if the customer replaces the test IC board or chip. The current pull out-assisting device consisting of chain and wire has imprecise propulsion distance, complex structure and high investment cost.

SUMMARY OF THE INVENTION

The present invention provides a semiconductor automatic test equipment load board pull out-assisting linkage device, which aims to solve the technical problems of imprecise propulsion distance, complex structure and high investment cost of pull out-assisting mechanism in the prior art.

A semiconductor automatic test equipment load board pull out-assisting linkage device used in the present invention to achieve the above purpose, comprising a handle, a rotating member, a linkage, a rotating plate, a universal connecting rod, a first pull out-assisting rod and a second pull out-assisting rod.

One end of the handle is rotatably connected to the test equipment by a rotating member. The middle of the handle is bolted to the linkage. The two rotating plates are fixedly connected to the linkage and are located at the two ends of the linkage. Each rotating plate is rotatably connected to the test equipment. Both the first pull out-assisting rod and the second pull out-assisting rod are fixedly connected to each rotating plate by a universal connecting rod. The first pull out-assisting rod and the second pull out-assisting rod are slidingly connected to the test equipment. The first pull out-assisting rod has a first pull out-assisting slot in the side wall, and the second pull out-assisting rod has a second pull out-assisting slot in the side wall, with the first pull out-assisting slot and the second pull out-assisting slot set in reverse.

Where, the first pull out-assisting slot comprises a first release section, a first compression section and a first extension section; the first release section is integrally formed with one end of the first extension section, and the first compression section is integrally formed with the other end of the first extension section.

Where, the second pull out-assisting slot comprises a second release section, a second compression section and a second extension section; the second release section is integrally formed with one end of the second extension section, and the second compression section is integrally formed with the other end of the second extension section.

Where, the first release section is provided opposite the second compression section and the second release section is provided opposite the first compression section.

Where, the aperture of the first extension decreases in sequence along the first release section to the first compression section, and the aperture of the second extension decreases in sequence along the second release section to the second compression section.

Where, the first extension section and the second extension section are set at an inclined angle.

Where, the first extension section and the second extension section have a tilt angle of 10° to 15°.

Where, the distance between the middle of the handle and the rotating member is less than the distance between the middle of the handle and the end of the handle away from the rotating member.

Where, the edge of the handle away from the rotating member end is set in a rounded structure.

Where, the handle has a non-slip pattern.

A semiconductor automatic test equipment load board pull out-assisting linkage device of the present invention, comprising: One end of the handle is rotatably connected to the test equipment by a rotating member. The middle of the handle is bolted to the linkage. The two rotating plates are fixedly connected to the linkage and are located at the two ends of the linkage. Each rotating plate is rotatably connected to the test equipment. Both the first pull out-assisting rod and the second pull out-assisting rod are fixedly connected to each rotating plate by a universal connecting rod. The first pull out-assisting rod and the second pull out-assisting rod are slidingly connected to the test equipment. The first pull out-assisting rod has a first pull out-assisting slot in the side wall, and the second pull out-assisting rod has a second pull out-assisting slot in the side wall, with the first pull out-assisting slot and the second pull out-assisting slot set in reverse. The first pull out-assisting rod and the second pull out-assisting rod cooperate with each other, which makes the pull out-assisting device precise in propulsion distance, simple in structure and low in investment cost.

BRIEF DESCRIPTION OF THE DRAWINGS

In order to more clearly illustrate the technical solutions in the embodiments or prior art of the present invention, the following is a brief description of the attached drawings that are required to be used in the description of the embodiments or prior art. Obviously, the attached drawings in the following description are only some embodiments of the present invention, and other drawings may be obtained from these attached drawings without creative effort by a person of ordinary skill in the art.

100—semiconductor automatic test equipment load board pull out-assisting linkage device, 10—handle, 20—rotating member, 30—rotating plate, 40—universal connecting rod, 50—first pull out-assisting rod, 51—first pull out-assisting slot, 511—first release section, 512—first compression section, 513—first extension section, 60—second pull out-assisting rod, 61—second pull out-assisting slot, 611—second release section, 612—second compression section, 613—second extension section, 70—linkage.

DETAILED DESCRIPTION OF THE PREFERRED EMBODIMENTS

Embodiments of the present invention are described in detail below. Examples of embodiments are shown in the attached drawings, wherein the same or similar labels from beginning to end indicate the same or similar components or components having the same or similar functions. The embodiments described below by reference to the attached drawings are exemplary and are intended to illustrate the present invention and are not to be construed as limiting the present invention.

In the description of the present invention, the terms "length", "width", "top", "bottom", "front", "back", "left", "right", "vertical", "horizontal", "inside", "outside", etc. indicate an orientation or positional relationship based on the orientation or positional relationship shown in the attached drawings and are intended only to facilitate and simplify the description of the present invention, not to indicate or imply that the device or component referred to must have a particular orientation, be constructed and operate in a particular orientation, and therefore are not to be construed as limiting the present invention. In addition, in the description of the present invention, "several" means two or more, unless otherwise expressly and specifically limited.

Referring to FIGS. 1 to 6, the present invention provides a semiconductor automatic test equipment load board pull out-assisting linkage 70 device 100 comprising a handle 10, a rotating member 20, a linkage 70, a rotating plate 30, a universal connecting rod 40, a first pull out-assisting rod 50 and a second pull out-assisting rod 60.

One end of the handle 10 is rotatably connected to the test equipment by a rotating member 20. The middle of the handle 10 is fixedly connected to the linkage 70 by bolts. The number of rotating plates 30 is two. The two rotating plates 30 are fixedly connected to the linkage 70 and are located at the two ends of the linkage 70. Each rotating plate 30 is rotatably connected to the test equipment. Both the first pull out-assisting rod 50 and the second pull out-assisting rod 60 are fixedly connected to each rotating plate 30 by a universal connecting rod 60. The first pull out-assisting rod 50 and the second pull out-assisting rod 60 are slidingly connected to the test equipment. The first pull out-assisting rod 50 has a first pull out-assisting slot 51 in the side wall, and the second pull out-assisting rod 60 has a second pull out-assisting slot 61 in the side wall, with the first pull out-assisting slot 51 and the second pull out-assisting slot 61 set in reverse.

Figure 1:
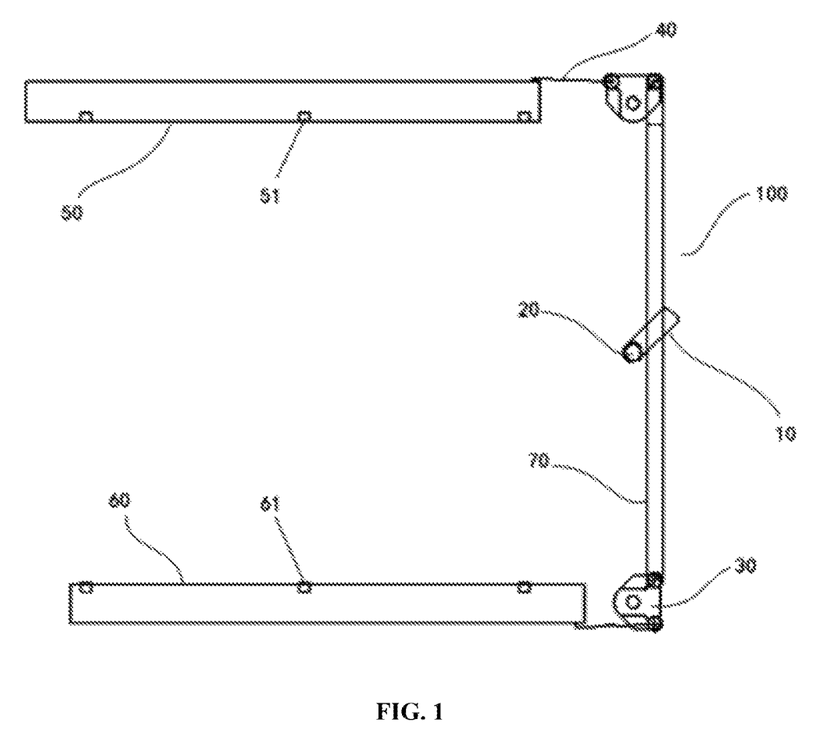
FIG. 1 is a schematic diagram of the structure of the load board pull out-assisting linkage device of the semiconductor automatic test equipment of the present invention in the release state.

In this embodiment, the rotating member 20 is a needle roller bearing. As shown in FIG. 1, the semiconductor automatic test equipment load board pull out-assisting linkage 70 device 100 is in the release state. The handle 10 is set at the specified angle to linkage 70 (initial position of handle 10). When the handle 10 is rotated with the rotating member 20 as the center, it drives the linkage 70 to translate. The linkage 70 pulls the two rotating plates 30 at each end. Each rotating plate 30 pulls the respective corresponding universal connecting rod 40. Each universal connecting rod 40 pulls the respective first pull out-assisting rod 50 and the second pull out-assisting rod 60 to move. The first pull out-assisting rod 50 is moved a specified distance toward the end away from the linkage 70. The second pull out-assisting rod 60 is moved a specified distance toward the end near linkage 70. Since the first pull out-assisting slot 51 and the second pull out-assisting slot 61 are set in reverse, the load board originally fixed between the first pull out-assisting slot 51 and the second pull out-assisting slot 61 is released, thus realizing the release of the load board from the equipment.

Figure 2:
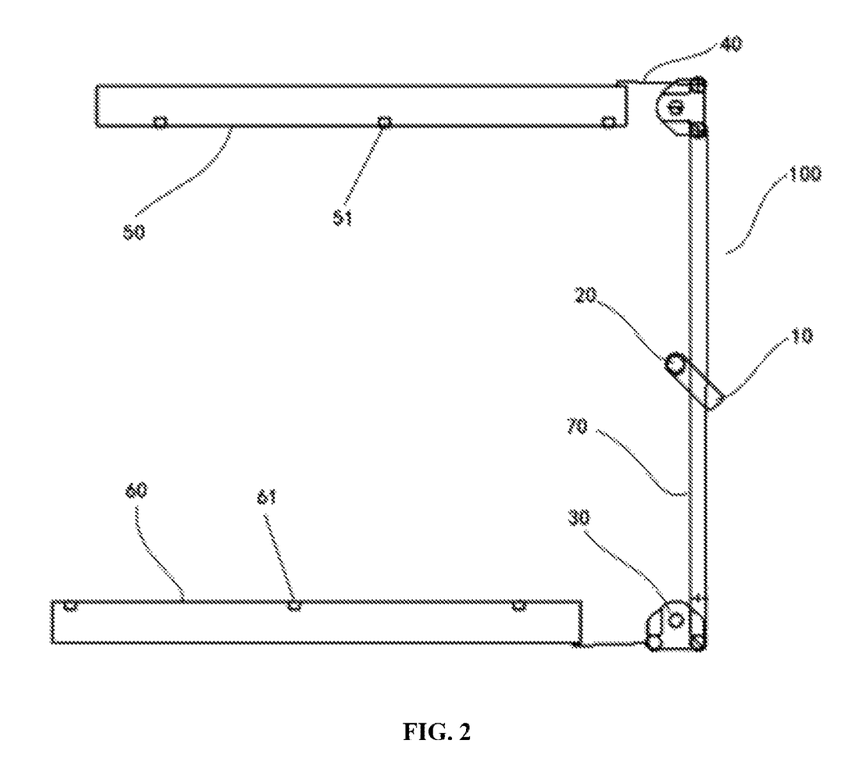
FIG. 2 is a schematic diagram of the structure of the load board pull out-assisting linkage device of the semiconductor automatic test equipment of the present invention in a compression state.
Figure 3:
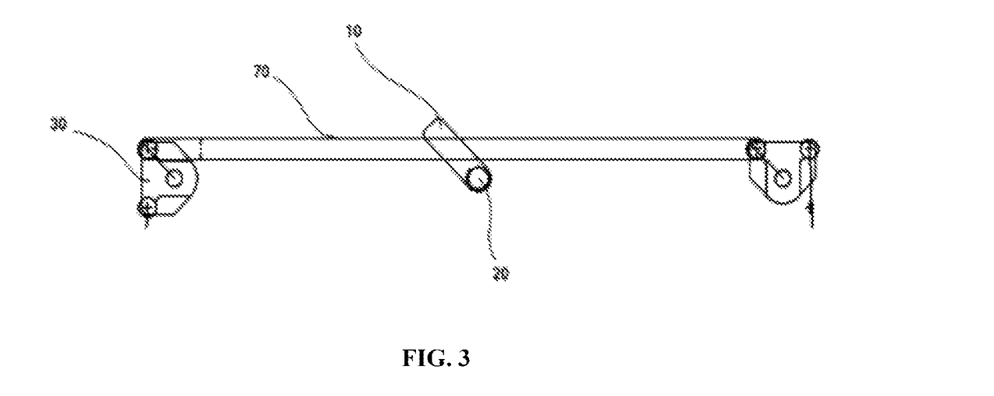
FIG. 3 is a schematic diagram of a portion of the structure of the load board pull out-assisting linkage device of the semiconductor automatic test equipment of the present invention.

As shown in FIG. 2, the semiconductor automatic test equipment load board pull out-assisting linkage 70 device 100 is in the release state. The handle 10 is set at the specified angle to linkage 70 (initial position of handle 10). When the handle 10 is rotated with the rotating member 20 as the center, it drives the linkage 70 to translate. The linkage 70 pulls the two rotating plates 30 at each end. Each rotating plate 30 pulls the respective corresponding universal connecting rod 40. Each universal connecting rod 40 pulls the respective first pull out-assisting rod 50 and the second pull out-assisting rod 60 to move. The first pull out-assisting rod 50 is moved a specified distance toward the end away from the linkage 70. The second pull out-assisting rod 60 is moved a specified distance toward the end near linkage 70. Since the first pull out-assisting slot 51 and the second pull out-assisting slot 61 are set in reverse, the load board originally fixed between the first pull out-assisting slot 51 and the second pull out-assisting slot 61 is compressed, thus realizing the compression of the load board and the equipment.

In conclusion: the semiconductor automatic test equipment load board pull out-assisting linkage 70 device 100 can realize the bearing load precise in propulsion distance, without the assistance of positioning devices to complete the propulsion distance confirmation, simple structure, low investment cost. In addition, during the load board pull-out process, it can ensure the same force on the matched European sockets to avoid bending the pins of the European sockets or excessive friction when the male and female connectors are matched, which prolongs the service life of the sockets.

Figure 4:
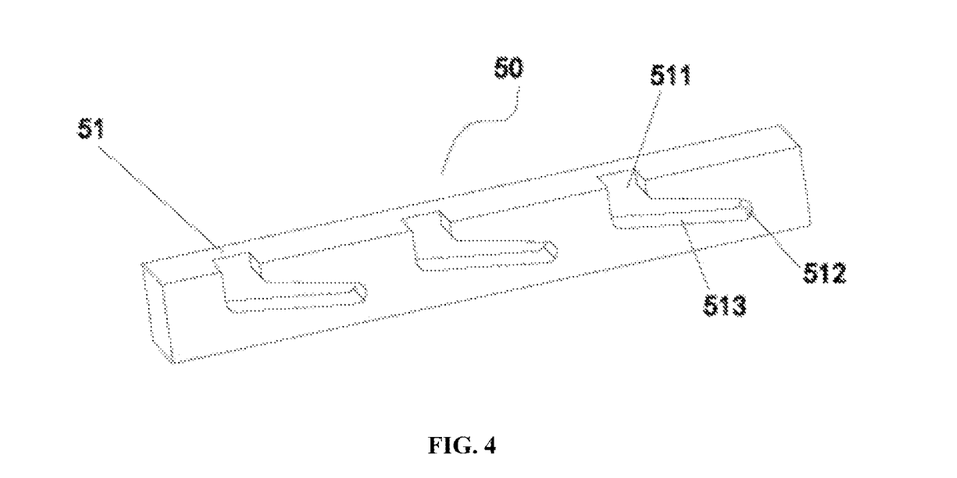
FIG. 4 is a schematic diagram of the structure of the first pull out-assisting lever of the present invention.
Figure 5:
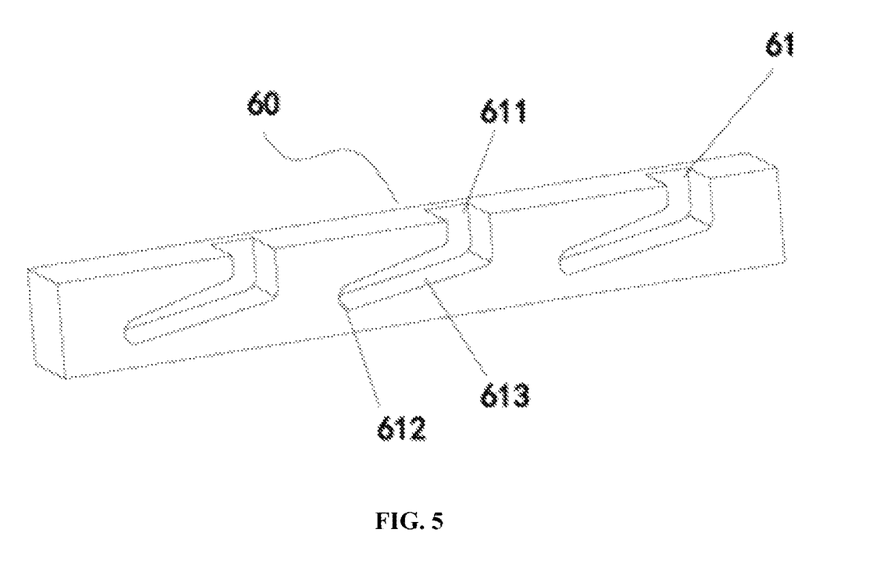
FIG. 5 is a schematic diagram of the structure of the second pull out-assisting rod of the present invention.
Figure 6:
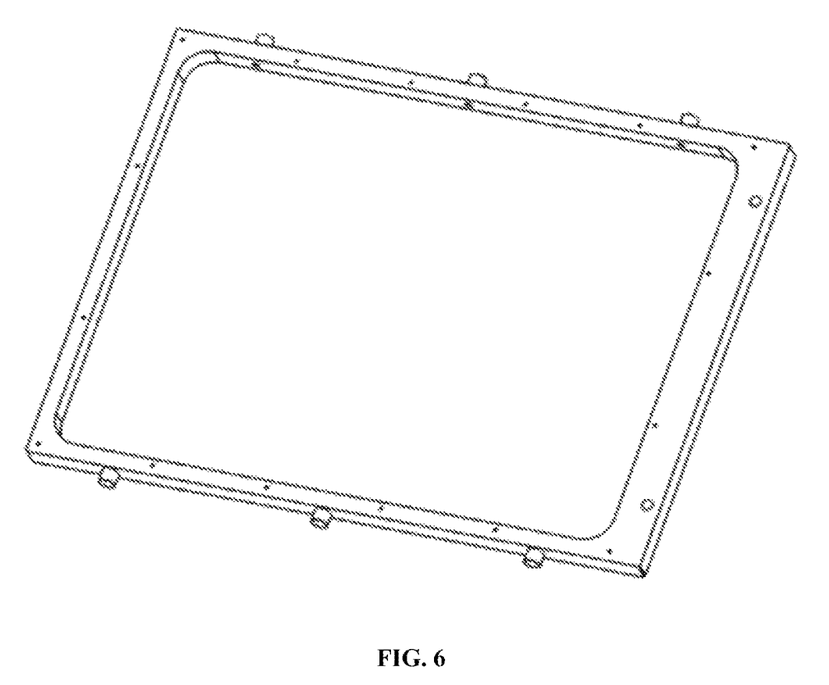
FIG. 6 is a schematic diagram of the structure of the load board of the present invention.

Furthermore, the first pull out-assisting slot 51 comprises a first release section 511, a first compression section 512 and a first extension section 513; the first release section 511 is integrally formed with one end of the first extension section 513, and the first compression section 512 is integrally formed with the other end of the first extension section 513. The second pull out-assisting slot 61 comprises a second release section 611, a second compression section 612 and a second extension section 613; the second release section 611 is integrally formed with one end of the second extension 613 section, and the second compression section 612 is integrally formed with the other end of the second extension section 613. The first release section 511 is provided opposite the second compression section 612 and the second release section 611 is provided opposite the first compression section 512. In this embodiment, the first pull out-assisting rod 50 is moved a specified distance toward the end away from the linkage 70; the second pull out-assisting rod 60 is moved a specified distance toward the end near linkage 70. Since the first pull out-assisting slot 51 and the second pull out-assisting slot 61 are set in reverse, the connector at one end of the load board will pass through the first compression section 512, the first extension section 513, and finally slide to the first release section 511; the connector at the other end of the load board will pass through the second compression section 612, the second extension section 613, and finally slide to the second release section 611. In this way, the load board pull out-assisting linkage 70 device 100 of the automatic semiconductor test equipment achieves precise propulsion distance of the bearing load, confirmation of the propulsion distance without the assistance of a positioning device, simple structure, and low investment cost.

Furthermore, the aperture of the first extension 513 decreases in sequence along the first release section 511 to the first compression section 512, and the aperture of the second extension 613 decreases in sequence along the second release section 611 to the second compression section 612.

In this embodiment, the aperture of the first extension 513 decreases along the first release section 511 to the first compression section 512; the aperture of the second extension 613 decreases along the second release section 611 to the second compression section 612, enabling the load board to be quickly compressed or released.

Furthermore, the first extension section 513 and the second extension section 613 are set at an inclined angle.

In this embodiment, both the first extension 513 and the second extension 613 are set at an inclined angle, which can make it more convenient and effortless for the user to pull-out the load board.

Furthermore, the first extension section 513 and the second extension section 613 have a tilt angle of 10° to 15°.

In this embodiment, the tilt angle of the first extension 513 and the second extension 613 is controlled at 10° to 15° to achieve maximum effort saving for the user when pull-out the load board.

Furthermore, the distance between the middle of the handle 10 and the rotating member 20 is less than the distance between the middle of the handle 10 and the end of the handle 10 away from the rotating member 20.

In this embodiment, by setting the distance between the handle 10 and the rotating member 20 is less than the distance between the middle of the handle 10 and the end of the handle 10 away from the rotating member 20, making it easier for the user to turn the handle 10 with less effort.

Furthermore, the edge of the handle 10 away from the rotating member 20 end is set in a rounded structure.

In this embodiment, the edge of the handle 10 away from the rotating member 20 is set in a rounded structure making the user's hand fit more closely when holding the handle 10.

Furthermore, the handle 10 has a non-slip pattern.

In this embodiment, the setting of the anti-slip pattern increases the friction between the handle 10 and the user's hand, playing a non-slip role.

The above disclosed is only a preferred embodiment of the present invention, which of course cannot be used to limit the scope of the present invention. A person of ordinary skill in the art understands that all or part of the process for realizing the above embodiments, with equivalent variations made in accordance with the claims of the invention, remains within the scope covered by the invention.

The invention claimed is:

1. A semiconductor automatic test equipment load board pull out-assisting linkage device, wherein the semiconductor automatic test equipment load board pull out-assisting linkage device is configured to release a load board off from test equipment or compress the load board onto the test equipment, the semiconductor automatic test equipment load board pull out-assisting linkage device comprises a handle, a rotating member, a linkage, two rotating plates, two universal connecting rods, a first pull out-assisting rod and a second pull out-assisting rod; one end of the handle is rotatably connected to the test equipment by the rotating member; the middle of the handle is bolted to the linkage; the two rotating plates are fixedly connected to the linkage and are located at two opposite ends of the linkage; each rotating plate is rotatably connected to the test equipment; one of the two universal connecting rods is connected between the first pull out-assisting rod and one of the two rotating plates, another of the two universal connecting rods is connected between the second pull out-assisting rod and another of the two rotating plates; the two rotating plates and the two universal connecting, rods are configured to allow rotation of the handle around the rotating member to bring the first pull out-assisting rod to move towards the linkage while bring the second pull out-assisting rod to move away from the linkage or to bring the first pull out-assisting rod to move away from the linkage while bring the second pull out-assisting rod to move towards the linkage; the first pull out-assisting rod and the second pull out-assisting rod are slidingly connected to the test equipment; the first out-assisting rod has a first lower surface facing the test equipment, a first upper surface away from the test equipment, and a first side wall connected between the first upper surface and the first lower surface, a first pull out-assisting slot is defined in the first side wall and extends from the first upper surface towards the lower surface and the linkage, and the second pull out-assisting rod has a second lower surface facing the test equipment, a second upper surface away from the test equipment and a second side wall connected between the second upper surface and the second lower surface, a second pull out-assisting slot is defined in the second side wall and extends from the second upper surface towards the second lower surface and away from the linkage, the first pull out-assisting slot and the second pull out-assisting slot are configured to slidably receive connectors arranged on two opposite sides of the load board respectively so as to clamp the load board between the first pull out-assisting slot and the second pull out-assisting slot.

2. The semiconductor automatic test equipment load board pull out-assisting linkage device as claimed in claim 1, wherein the first pull out-assisting slot comprises a first release section, a first compression section and a first extension section; the first release section is integrally formed with one end of the first extension section, and the first compression section is integrally formed with the other end of the first extension section.

3. The semiconductor automatic test equipment load board pull out-assisting linkage device as claimed in claim 2, wherein the second pull out-assisting slot comprises a second release section, a second compression section and a second extension section; the second release section is integrally formed with one end of the second extension section, and the second compression section is integrally formed with the other end of the second extension section.

4. The semiconductor automatic test equipment load board pull out-assisting linkage device as claimed in claim 3, wherein the first release section is provided opposite the second compression section and the second release section is provided opposite the first compression section.

5. The semiconductor automatic test equipment load board pull out-assisting linkage device as claimed in claim 4, wherein the aperture of the first extension decreases in sequence along the first release section to the first compression section, and the aperture of the second extension decreases in sequence along the second release section to the second compression section.

6. The semiconductor automatic test equipment load board pull out-assisting linkage device as claimed in claim 5, wherein both the first extension section and the second extension section are set at an inclined angle.

7. The semiconductor automatic test equipment load board pull out-assisting linkage device as claimed in claim 6, wherein both the first extension section and the second extension section have a tilt angle of 10° to 15°.

8. The semiconductor automatic test equipment load board pull out-assisting linkage device as claimed in claim 7, wherein the distance between the middle of the handle and the rotating member is less than the distance between the middle of the handle and the end of the handle away from the rotating member.

9. The semiconductor automatic test equipment load board pull out-assisting linkage device as claimed in claim 8, wherein the edge of the handle away from the rotating member end is set in a rounded structure.

10. The semiconductor automatic test equipment load board pull out-assisting linkage device as claimed in claim 9, wherein the handle has a non-slip pattern.

* * * * *